United States Patent
Park et al.

(10) Patent No.: US 8,322,542 B2
(45) Date of Patent: Dec. 4, 2012

(54) CASSETTE FOR RECEIVING SUBSTRATES (75) Inventors: Moo Yeol Park, Taegu-kwangyokshi (KR); Sung Su Jung, Taegu-kwangyokshi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/322,553

(22) Filed: Dec. 19, 2002

(65) Prior Publication Data
US 2003/0173316 A1    Sep. 18, 2003

(30) Foreign Application Priority Data
Mar. 15, 2002 (KR) .................. 10-2002-0014196

(51) Int. Cl.
A47G 19/08 (2006.01)
(52) U.S. Cl. .................................... 211/41.18
(58) Field of Classification Search ............. 211/41.18, 211/41.1, 41.17, 41.12, 41.7, 41.14, 26, 134; 206/710, 454, 832; 414/935
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,653,864 A | 3/1987 | Baron | |
| 4,691,995 A | 9/1987 | Yamazaki | |
| 4,775,225 A | 10/1988 | Tsuboyama | |
| 5,247,377 A | 9/1993 | Omeis | |
| 5,263,888 A | 11/1993 | Ishihara | |
| 5,406,989 A | 4/1995 | Abe | |
| 5,499,128 A | 3/1996 | Hasegawa | |
| 5,507,323 A | 4/1996 | Abe | |
| 5,511,591 A | 4/1996 | Abe | |
| 5,539,545 A | 7/1996 | Shimizu | |
| 5,548,429 A | 8/1996 | Tsuiita | |
| 5,577,621 A * | 11/1996 | Yi | 211/41.18 |
| 5,642,214 A | 6/1997 | Ishii | |
| 5,680,189 A | 10/1997 | Shimizu | |
| 5,742,370 A | 4/1998 | Kim | |
| 5,757,451 A | 5/1998 | Miyazaki et al. | |
| D396,986 S * | 8/1998 | Robinson et al. | D6/630 |
| 5,852,484 A | 12/1998 | Inoue et al. | |
| 5,854,664 A | 12/1998 | Inoue et al. | |
| 5,861,932 A | 1/1999 | Inata et al. | |
| 5,875,922 A | 3/1999 | Chastine et al. | |
| 5,890,598 A * | 4/1999 | Hayashida et al. | 206/710 |
| 5,952,676 A | 9/1999 | Sato et al. | |
| 5,956,112 A | 9/1999 | Fujimori et al. | |
| 6,001,203 A | 12/1999 | Yamada et al. | |
| 6,011,609 A | 1/2000 | Kato et al. | |
| 6,016,178 A | 1/2000 | Kataoka et al. | |
| 6,016,181 A | 1/2000 | Shimada | |

(Continued)

FOREIGN PATENT DOCUMENTS

EP    1 003 066    5/2000

(Continued)

Primary Examiner — Jennifer E. Novosad
(74) Attorney, Agent, or Firm — McKenna, Long and Aldridge, LLP.

(57) ABSTRACT

A cassette for receiving substrates includes a frame, and a plurality of support plates protruding from both lateral sides of the frame, wherein the support plates have a width and length large enough to support the substrates without a bending and an access space for a robot arm to transport the substrates, an area of the access space corresponding to an area of the robot arm.

1 Claim, 6 Drawing Sheets

U.S. PATENT DOCUMENTS

| | | | |
|---|---|---|---|
| 6,055,035 A | 4/2000 | von Gutfeld et al. | |
| 6,163,357 A | 12/2000 | Nakamura | |
| 6,171,400 B1 * | 1/2001 | Wingo | 118/500 |
| 6,219,126 B1 | 4/2001 | Von Gutfeld | |
| 6,226,067 B1 | 5/2001 | Nishiguchi et al. | |
| 6,236,445 B1 | 5/2001 | Foschaar et al. | |
| 6,297,869 B1 | 10/2001 | Choo et al. | |
| 6,304,306 B1 | 10/2001 | Shiomi et al. | |
| 6,304,311 B1 | 10/2001 | Egami et al. | |
| 6,337,730 B1 | 1/2002 | Ozaki et al. | |
| 6,414,733 B1 | 7/2002 | Ishikawa et al. | |
| 6,450,346 B1 * | 9/2002 | Boyle et al. | 211/41.18 |
| 6,464,445 B2 * | 10/2002 | Knapik et al. | 414/416.03 |
| 6,488,497 B1 * | 12/2002 | Buckley et al. | 432/258 |
| 6,615,994 B2 * | 9/2003 | Cu, Jr. | 211/41.18 |
| 7,500,564 B2 * | 3/2009 | Choi | 206/711 |
| 2001/0021000 A1 | 9/2001 | Egami | |

FOREIGN PATENT DOCUMENTS

| | | |
|---|---|---|
| JP | 51-65656 | 6/1976 |
| JP | 57-38414 | 3/1982 |
| JP | 57-88428 | 6/1982 |
| JP | 58-27126 | 2/1983 |
| JP | 59-57221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-7822 | 1/1986 |
| JP | 61-55625 | 3/1986 |
| JP | S62-054225 | 3/1987 |
| JP | S62-054228 | 3/1987 |
| JP | S62-054229 | 3/1987 |
| JP | 62-89025 | 4/1987 |
| JP | 62-90622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 62-189031 | 6/1989 |
| JP | 01-037109 | 10/1990 |
| JP | 02-127035 | 10/1990 |
| JP | H03-009549 | 1/1991 |
| JP | H05-036425 | 2/1993 |
| JP | H05-036426 | 2/1993 |
| JP | H05-107533 | 4/1993 |
| JP | 5-127179 | 5/1993 |
| JP | 5-154923 | 6/1993 |
| JP | 5-265011 | 10/1993 |
| JP | 5-281557 | 10/1993 |
| JP | 5-281562 | 10/1993 |
| JP | H06-018829 | 1/1994 |
| JP | 6-51256 | 2/1994 |
| JP | H06-064229 | 3/1994 |
| JP | 6-148657 | 5/1994 |
| JP | 6-160871 | 6/1994 |
| JP | H06-194637 | 7/1994 |
| JP | 6-235925 | 8/1994 |
| JP | 6-265915 | 9/1994 |
| JP | 6-313870 | 11/1994 |
| JP | 7-84268 | 3/1995 |
| JP | 7-128674 | 5/1995 |
| JP | 7-181507 | 7/1995 |
| JP | H07-275770 | 10/1995 |
| JP | H07-275771 | 10/1995 |
| JP | H08-076133 | 3/1996 |
| JP | 8-95066 | 4/1996 |
| JP | 8-101395 | 4/1996 |
| JP | 8-106101 | 4/1996 |
| JP | H08-110504 | 4/1996 |
| JP | H08-136937 | 5/1996 |
| JP | 8-171094 | 7/1996 |
| JP | 8-190099 | 7/1996 |
| JP | H08-173874 | 7/1996 |
| JP | 8-240807 | 9/1996 |
| JP | 9-5762 | 1/1997 |
| JP | 9-26578 | 1/1997 |
| JP | H09-001026 | 1/1997 |
| JP | 09-036219 A | 2/1997 |
| JP | 9-61829 | 3/1997 |
| JP | 9-73075 | 3/1997 |
| JP | 9-73096 | 3/1997 |
| JP | H09-094500 | 4/1997 |
| JP | 9-127528 | 5/1997 |
| JP | 9-230357 | 9/1997 |
| JP | 9-281511 | 10/1997 |
| JP | 9-311340 | 12/1997 |
| JP | 10-123537 | 5/1998 |
| JP | 10-123538 | 5/1998 |
| JP | 10-142616 | 5/1998 |
| JP | 10-177178 | 6/1998 |
| JP | H10-174924 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-14953 | 1/1999 |
| JP | 11-38424 | 2/1999 |
| JP | 11-64811 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | H11-262712 | 9/1999 |
| JP | H11-264991 | 9/1999 |
| JP | 11-326922 | 11/1999 |
| JP | 11-344714 | 12/1999 |
| JP | 2000-2879 | 1/2000 |
| JP | 2000-29035 | 1/2000 |
| JP | 2000-56311 | 2/2000 |
| JP | 2000-66165 | 3/2000 |
| JP | 2000-066218 | 3/2000 |
| JP | 2000-093866 | 4/2000 |
| JP | 2000-137235 | 5/2000 |
| JP | 2000-142876 | 5/2000 |
| JP | 2000-142876 A | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-5401 | 1/2001 |
| JP | 2001-5405 | 1/2001 |
| JP | 2001-13506 | 1/2001 |
| JP | 2001-33793 | 2/2001 |
| JP | 2001-42341 | 2/2001 |
| JP | 2001-51284 | 2/2001 |
| JP | 2001-66615 | 3/2001 |
| JP | 2001-91727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |
| JP | 2001-183683 | 7/2001 |
| JP | 2001-201750 | 7/2001 |
| JP | 2001-209052 | 8/2001 |
| JP | 2001-209056 | 8/2001 |
| JP | 2001-209057 | 8/2001 |
| JP | 2001-209058 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |

| | | | | | |
|---|---|---|---|---|---|
| JP | 2001-264782 | 9/2001 | JP | 2002-202514 | 7/2002 |
| JP | 2001-272640 | 10/2001 | JP | 2002-214626 | 7/2002 |
| JP | 2001-281675 | 10/2001 | JP | 2002-229042 | 8/2002 |
| JP | 2001-281678 | 10/2001 | JP | 2002-236276 | 8/2002 |
| JP | 2001-282126 | 10/2001 | JP | 2002-258299 | 8/2002 |
| JP | 2001-305563 | 10/2001 | JP | 2002-236292 | 9/2002 |
| JP | 2001-330837 | 11/2001 | JP | 2002-277865 | 9/2002 |
| JP | 2001-330840 | 11/2001 | JP | 2002-277866 | 9/2002 |
| JP | 2001-356353 | 12/2001 | JP | 2002-277881 | 9/2002 |
| JP | 2001-356354 | 12/2001 | JP | 2002-287156 | 10/2002 |
| JP | 2002-14360 | 1/2002 | JP | 2002-296605 | 10/2002 |
| JP | 2002-23176 | 1/2002 | JP | 2002-311438 | 10/2002 |
| JP | 2002-49045 | 2/2002 | JP | 2002-311440 | 10/2002 |
| JP | 2002-076108 | 3/2002 | JP | 2002-311442 | 10/2002 |
| JP | 2002-079160 | 3/2002 | JP | 2002-323687 | 11/2002 |
| JP | 2002-080321 | 3/2002 | JP | 2002-323694 | 11/2002 |
| JP | 2002-82340 | 3/2002 | JP | 2002-333628 | 11/2002 |
| JP | 2002-90759 | 3/2002 | JP | 2002-333635 | 11/2002 |
| JP | 2002-90760 | 3/2002 | JP | 2002-333843 | 11/2002 |
| JP | 2002-107740 | 4/2002 | JP | 2002-341329 | 11/2002 |
| JP | 2002-122870 | 4/2002 | JP | 2002-341355 | 11/2002 |
| JP | 2002-122872 | 4/2002 | JP | 2002-341356 | 11/2002 |
| JP | 2002-122873 | 4/2002 | JP | 2002-341357 | 11/2002 |
| JP | 2002-131762 | 5/2002 | JP | 2002-341358 | 11/2002 |
| JP | 2002-139734 | 5/2002 | JP | 2002-341359 | 11/2002 |
| JP | 2002-156518 | 5/2002 | JP | 2002-341362 | 11/2002 |
| JP | 2002-169166 | 6/2002 | KR | 1999-0040889 | 6/1999 |
| JP | 2002-169167 | 6/2002 | KR | 2000-0035302 | 6/2000 |
| JP | 2002-182222 | 6/2002 | | | |
| JP | 2002-202512 | 7/2002 | | | |

* cited by examiner

CASSETTE FOR RECEIVING SUBSTRATES

This application claims the benefit of the Korean Patent Application No. P2002-014196 filed on Mar. 15, 2002, which is hereby incorporated by reference.

BACKGROUND OF THE INVENTION

1. Field of the Invention

The present invention relates to a storage means, and more particularly, to a cassette for receiving substrates. Although the present invention is suitable for a wide scope of applications, it is particularly suitable for receiving wide mother substrates having large liquid crystal display panels formed thereon, thereby preventing deterioration of the mother substrates and effectively transporting the mother substrates in a working space.

2. Discussion of the Related Art

In order to improve yield, a method of fabricating a liquid crystal display device generally includes the steps of forming thin film transistor array substrates on a mother substrate, forming color filter substrates on the other mother substrate, and bonding both of the mother substrates to each other to form a plurality of liquid crystal display panels at the same time.

Figure 1:
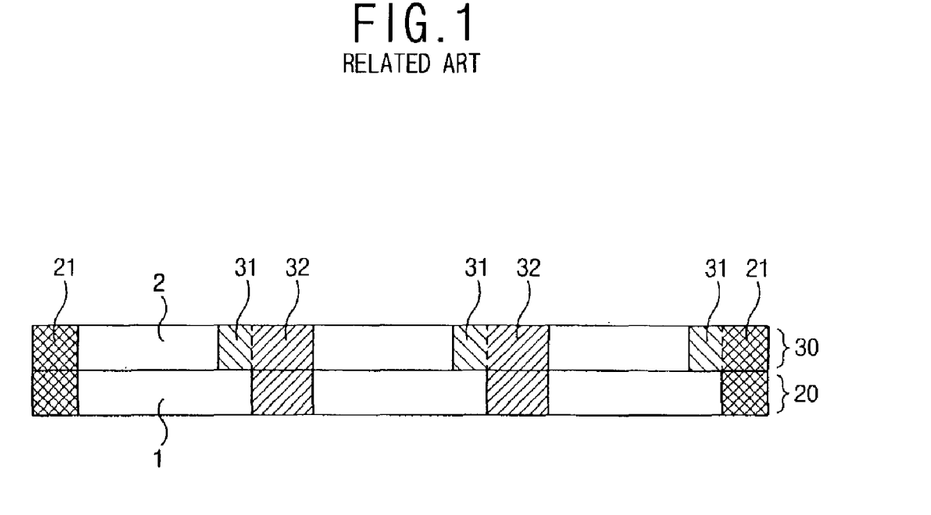
FIG. 1 illustrates a cross-sectional view of a first mother substrate having thin film transistor array substrates and a second mother substrate having color filter substrates according to a related art, in which the first and second mother substrates are bonded to each other to form a plurality of liquid crystal display panels.

FIG. 1 illustrates a cross-sectional view of a first mother substrate having thin film transistor array substrates and a second mother substrate having color filter substrates, in which the first and second mother substrates are bonded to each other to form a plurality of liquid crystal display panels.

Referring to FIG. 1, in unit liquid crystal display panels, each of thin film transistor array substrates has a side protruding from each corresponding color filter substrate 2. The gate and pad data parts (not shown) are formed at the corresponding edges of the thin film transistor array substrate 1 that do not overlap the color filter substrate 2.

Hence, the color filter substrates 2 of the second mother substrate 30 are formed to be spaced apart from each other by a dummy area 31, which corresponds to the protruding portion of each thin film transistor array substrate 1 of the first mother substrate 20.

The unit liquid crystal display panels are arranged so as to maximize the use of the first and second mother substrates 20 and 30. Depending upon various models, the unit liquid crystal display panels are generally formed to be spaced apart from each other by an area amounting to the other dummy area 32.

After the first mother substrate having the thin film transistor array substrates 1 is bonded to the second mother substrate 30 having the color filter substrates 2, the liquid crystal display panels are individually cut by a cutting process. The cutting process of the liquid crystal display panels is generally separated from the bonding process due to a limitation in a working area.

Hence, the bonded mother substrates are sequentially stored in a receiving space of a cassette. Once the receiving space is filled with the bonded mother substrates, the cassette is transferred to carry out the cutting process of the liquid crystal display panels. A related art cassette for receiving substrates is explained in detail by referring to the attached drawings as follows.

Figure 2:
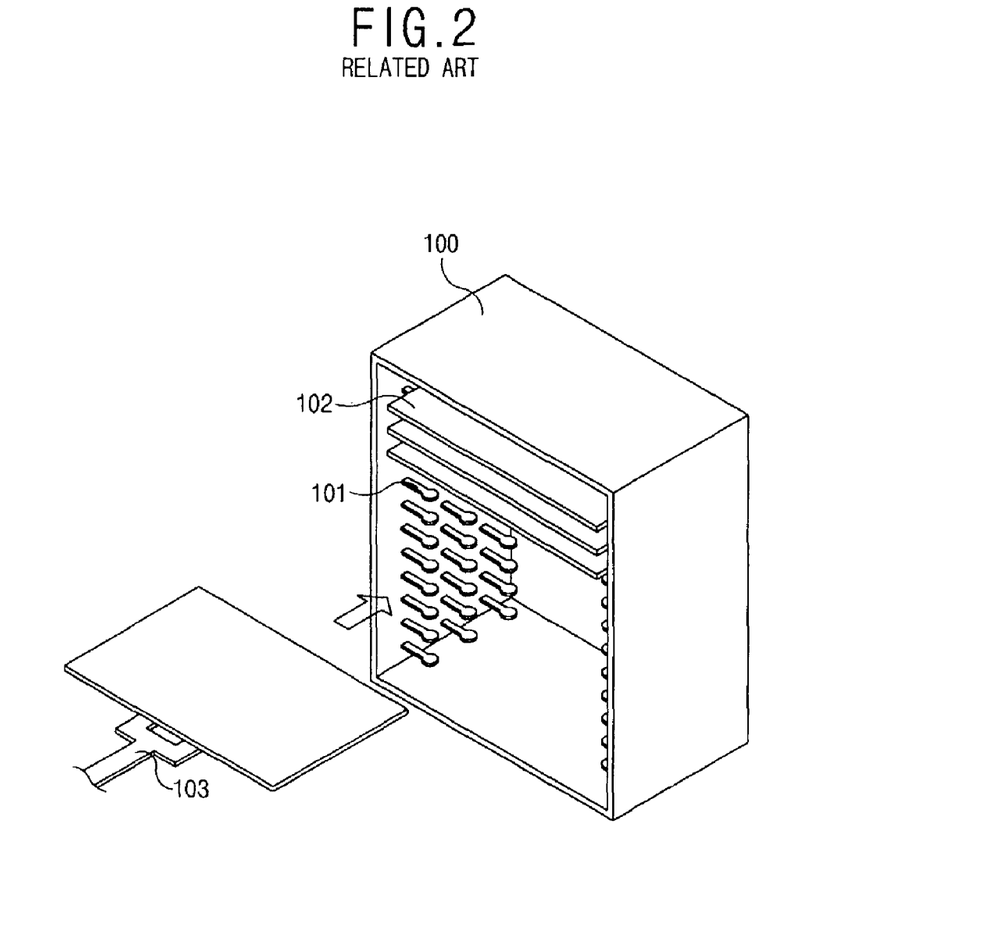
FIG. 2 illustrates a perspective view of a related art cassette for receiving substrates.

FIG. 2 illustrates a plane view of a related art cassette for receiving substrates. As shown in FIG. 2, the related art cassette for receiving substrates includes a frame 100 having an opening at the front side and support pins 101 protruding from both sides of the frame 100 to support the mother substrates 102 received in the frame 100.

Figure 3:
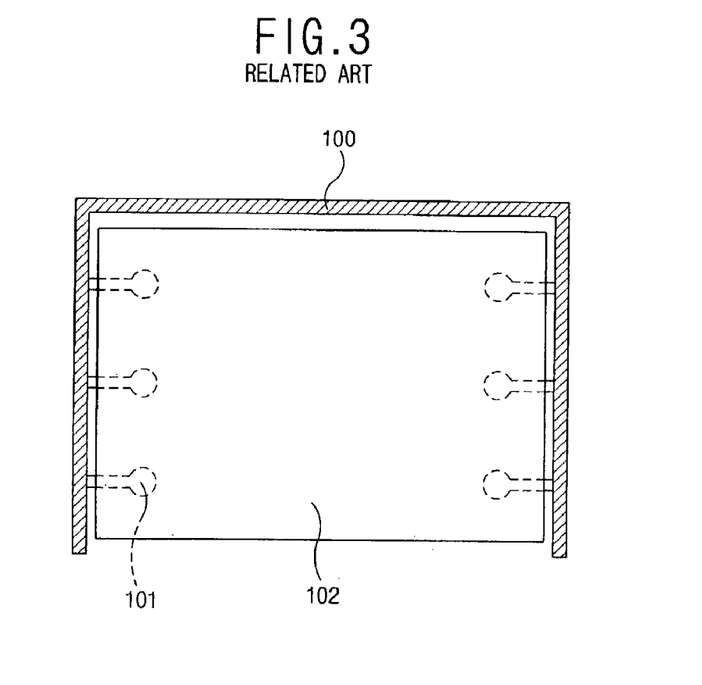
FIG. 3 is a layout of a cassette for receiving substrates illustrating that a mother substrate is supported by support pins of FIG. 1.

FIG. 3 is a layout of the related art cassette for receiving substrates illustrating that the mother substrate 102 is supported by the support pins 101. As shown in FIG. 3, three of the support pins 101 protruding from each of the two lateral sides of the frame 100 are spaced apart from one another. Hence, three pairs of the support pins 101 support the mother substrate 102.

Namely, three pairs of the support pins 101 protruding from both lateral sides of the frame 100 have the same height, thereby stably supporting one of the mother substrates 102. In addition, the support pins 101 protruding from both lateral sides of the frame 100 are arranged regularly to correspond to the number of the mother substrates 102 to be received.

For instance, in case of a cassette receiving twenty mother substrates 102, the support pins 101 having a 3×20 arrangement protrude from each of the two lateral sides of the frame 100 to face into the corresponding ones.

In order to dispose the mother substrate 102 in the frame 100, the mother substrate 102 is loaded on a robot arm 103 (shown in FIG. 2) and is then transferred into the frame 100 to be slightly higher than the support pins 101 provided in the receiving space. Subsequently, the robot arm 103 is lowered to locate the mother substrate 102 on the support pins 101.

Once the frame 100 is filled with the bonded mother substrates 102, the cassette is transferred to carry out the following cutting process. However, the cassette having the frame 100 filled with the mother substrates 102 is frequently on hold due to delays in the cutting process of the liquid crystal display panels.

When the cassette is on standby, there is no problem in fabricating a small-sized liquid crystal display panel, since the mother substrate is small in size. However, when fabricating a product having a large-sized liquid crystal display panel, a degradation may occur because the size of the mother substrate itself is increased.

Meanwhile, when fabricating a product having a small-sized liquid crystal display panel, a liquid crystal injection method is used. Herein, the liquid crystal injection method includes the steps of injecting liquid crystals after the fabricated liquid crystal display panels are cut into individual unit liquid crystal display panels. However, when the liquid crystal injection method is used for a large-sized liquid crystal display panel, a processing time of the liquid crystal injection method takes longer, thereby reducing productivity.

As a result, a liquid crystal dropping method has been proposed in fabricating a large-sized liquid crystal display panel.

The liquid crystal dropping method includes the steps of dropping liquid crystals on a plurality of thin film transistor array substrates fabricated on a first mother substrate or on a plurality of color filter substrates fabricated on a second mother substrate, bonding the first and second mother substrates to each other to form a plurality of liquid crystal display panels, and cutting the bonded mother substrates into individual unit liquid crystal display panels. Hence, the liquid crystal dropping method minimizes product degradation because it can be applicable to the large-sized liquid crystal display panel.

However, when a product having the large-sized liquid crystal display panel is prepared by using the liquid crystal dropping method, weight and size of the mother substrates are increased, thereby increasing the degradation of the liquid crystal display panels.

Namely, when a product having the large-sized liquid crystal display panel is prepared by using the liquid crystal dropping method, the size of the mother substrate 102 or the weight of the liquid crystal display panel formed with the liquid crystal (LC)-dropped bonded substrates increases. Hence, when the waiting time of the cassette is extended, either the mother substrate 102 or the liquid crystal display panel supported by the support pins 101 protruding from both lateral sides of the frame 100 may be deteriorated in a manner that the central portion of the mother substrate or the liquid crystal display panel bends down. Hence, patterns of the liquid crystal display panels on the mother substrates 102 may be damaged or deteriorated. As for the bonded substrates having the liquid crystals therein, the panel itself is degraded.

Moreover, as the weight of the mother substrate 102 or the liquid crystal display panel is concentrated on the support pins 101, the characteristics of the liquid crystals in the areas of the mother substrate 102 contacting with the support pins 101 are degraded, thereby causing a display failure of the product.

Hence, the related art cassette increases product deficiency and reduces productivity.

SUMMARY OF THE INVENTION

Accordingly, the present invention is directed to a cassette for receiving substrates that substantially obviates one or more of problems due to limitations and disadvantages of the related art.

Another object of the present invention is to provide a cassette for receiving substrates preventing deterioration of the mother substrates having large-sized liquid crystal display panels formed thereon when a waiting time is extended.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cassette for receiving substrates according to the present invention includes a frame, and a plurality of support plates protruding from both lateral sides of the frame whereon the support plates have a width and length large enough to support the substrates without a bending and to provide a releasing space for a robot arm from the cassette after the robot arm transports the substrate on the support plates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 5:
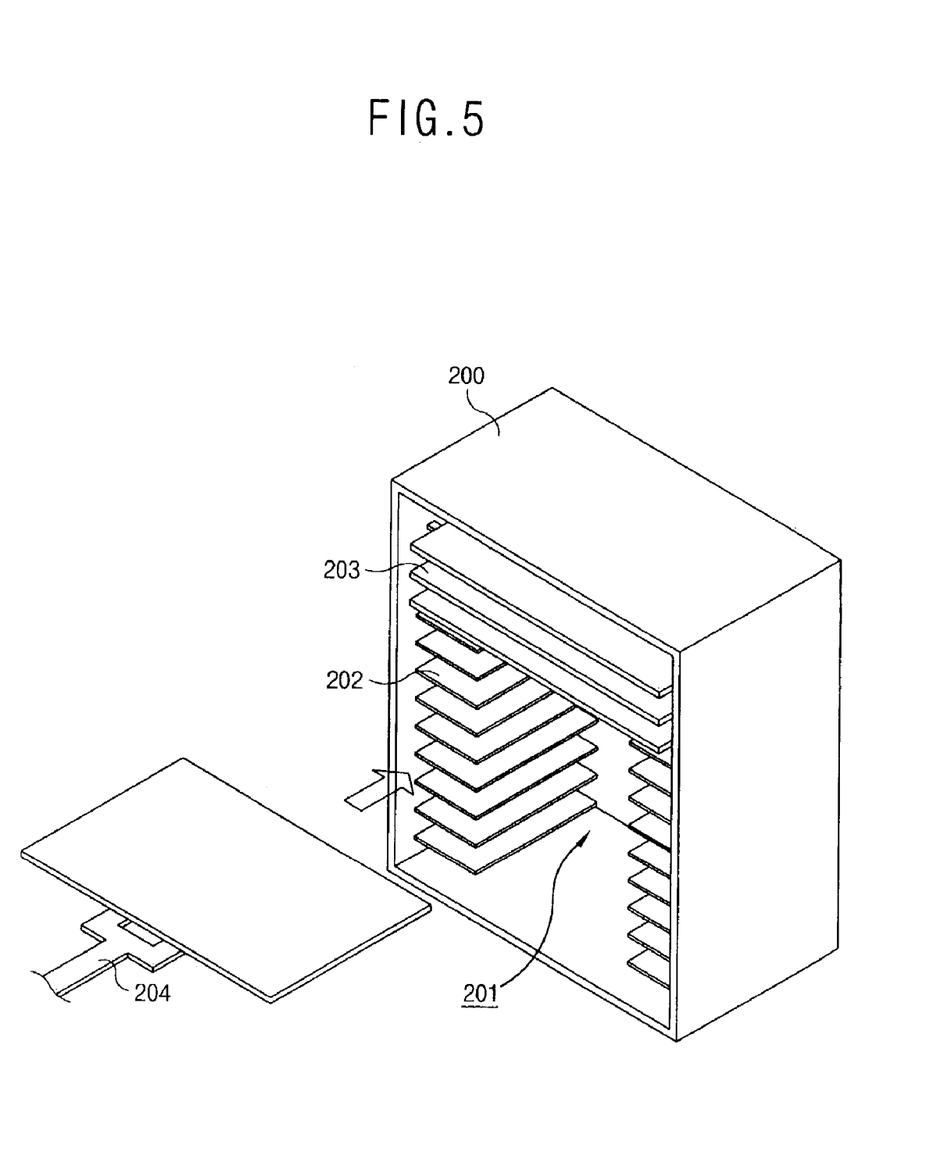
FIG. 5 illustrates a perspective view of a cassette for receiving substrates according to a first embodiment of the present invention.

FIG. 5 illustrates a perspective view of a cassette for receiving substrates according to a first embodiment of the present invention. As shown in FIG. 5, the cassette for receiving substrates according to the first embodiment of the present invention includes a frame 200 having an opening at the front side and a plurality of support plates 202 protruding from both lateral sides of the frame 200 so as to provide a space 201 therebetween. The support plates 202 at each lateral side are mounted on each lateral side while being spaced apart in order to receive mother substrates 203. Although there is no specific length and width required for the support plates 202, a dimension of the support plates 202 should be wide and long enough to support the mother substrates 203 without a bending problem.

Figure 6:
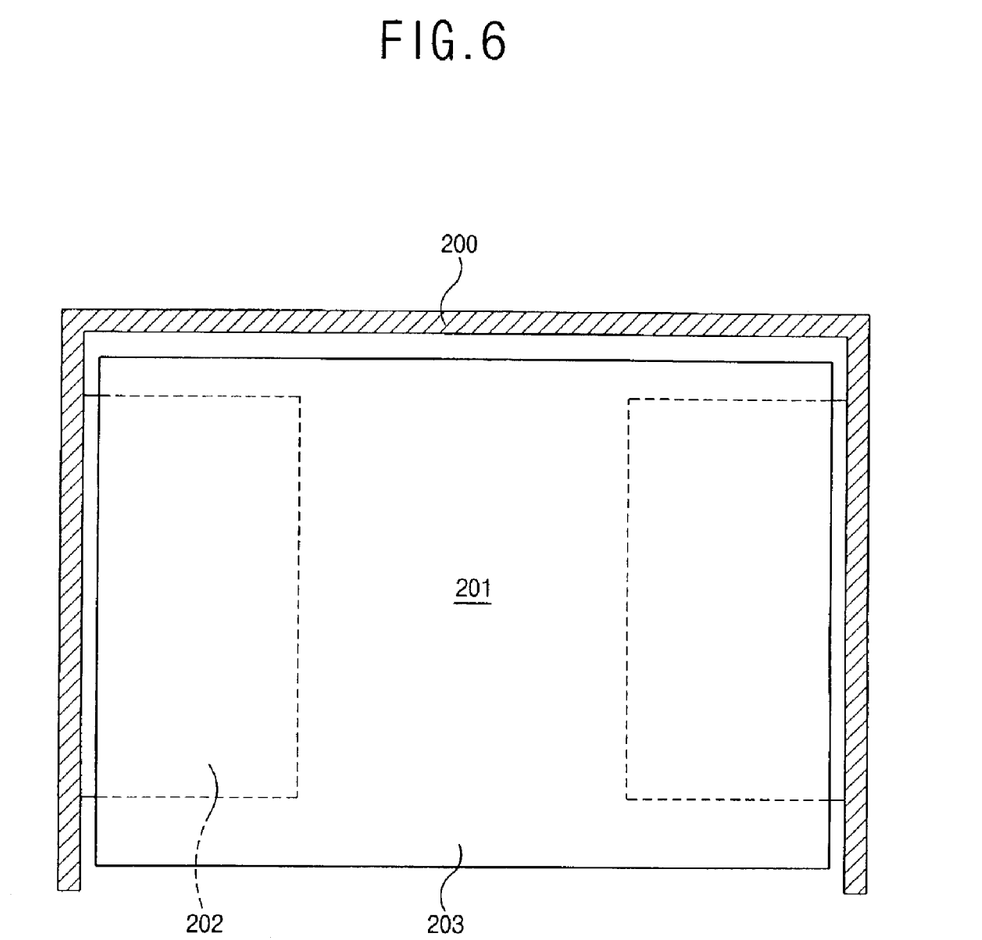
FIG. 6 is a layout of the cassette for receiving substrates according to the present invention illustrating that a mother substrate is supported by the support plates in FIG. 5.

FIG. 6 is a layout of the cassette for receiving substrates according to the present invention illustrating that the support plates 202 support the mother substrate in FIG. 5. As shown in FIG. 6, a pair of support plates 202 protruding from both lateral sides of a frame 200 to provide a separating space 201 in the middle portion supports the mother substrate 203.

The mother substrate 203 is prepared by bonding a first mother substrate having thin film transistor array substrates and a second mother substrate having color filter substrates to each other. The mother substrate 203 may also be applicable to fabricate a liquid crystal display device. Hence, the thin film transistor array substrates on the first mother substrate are bonded to the color filter substrates on the second mother substrate, thereby forming a plurality of liquid crystal display panels.

Moreover, when a liquid crystal layer is formed by a liquid crystal dropping method, a liquid crystal display panel including the bonded substrates having the liquid crystal layer therebetween can be used as the mother substrate 203.

Liquid crystals are dropped on the first mother substrate. A sealant can be formed on the second mother substrate to bond the first and second mother substrates to each other. And, the steps of dropping the liquid crystal and forming the sealant can be carried out on either the first mother substrate or the second mother substrate.

The separating space 201 at the central portion between the support plates 202 is provided for a robot arm 204 to return back to the position from the frame 200 after unloading the substrates 203. The robot arm 204 loading the mother substrate 203 is transferred into the frame 200 at a level slightly higher than the support plates 202, and then lowered to the mother substrate 203 supported by the support plates 202.

Figure 4:
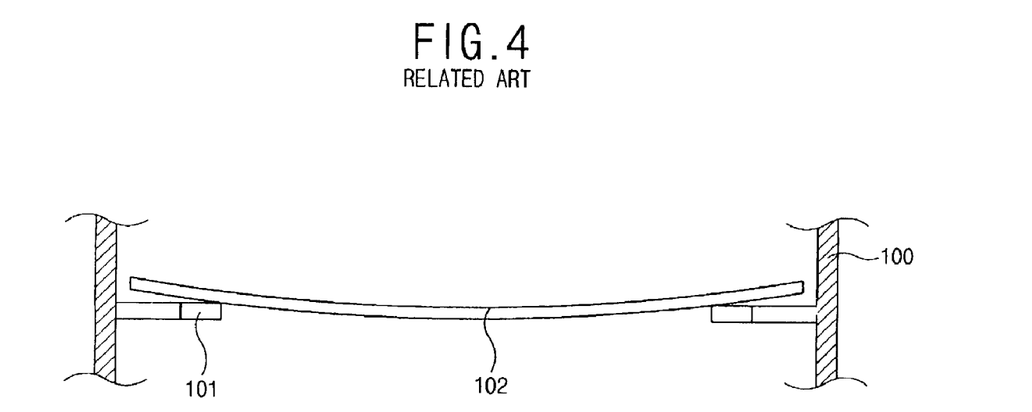
FIG. 4 is a cross-sectional view of a large-sized mother substrate supported by the related art illustrating a bending problem.

Compared to the pin type support pins 101 according to the related art shown in FIG. 4, the flat support plates 202 according to the first embodiment of the present invention minimize deterioration of the mother substrate 203 caused by the bending of the central portion of the mother substrate 203 and to disperse the weight of the mother substrate 203.

Namely, even when the size of the mother substrate 203 having large liquid crystal display panels formed thereon by the liquid crystal dropping method is increased, the present invention can control the deterioration caused by the bending of the central portion of the mother substrate 203, when the waiting time of the cassette is extended by various situations of the following cutting process. Moreover, the present invention disperses the weight of the mother substrate 203, thereby preventing degradation of the characteristics of the liquid crystals in the area of the mother substrate contacting the support plates 202.

Figure 7:
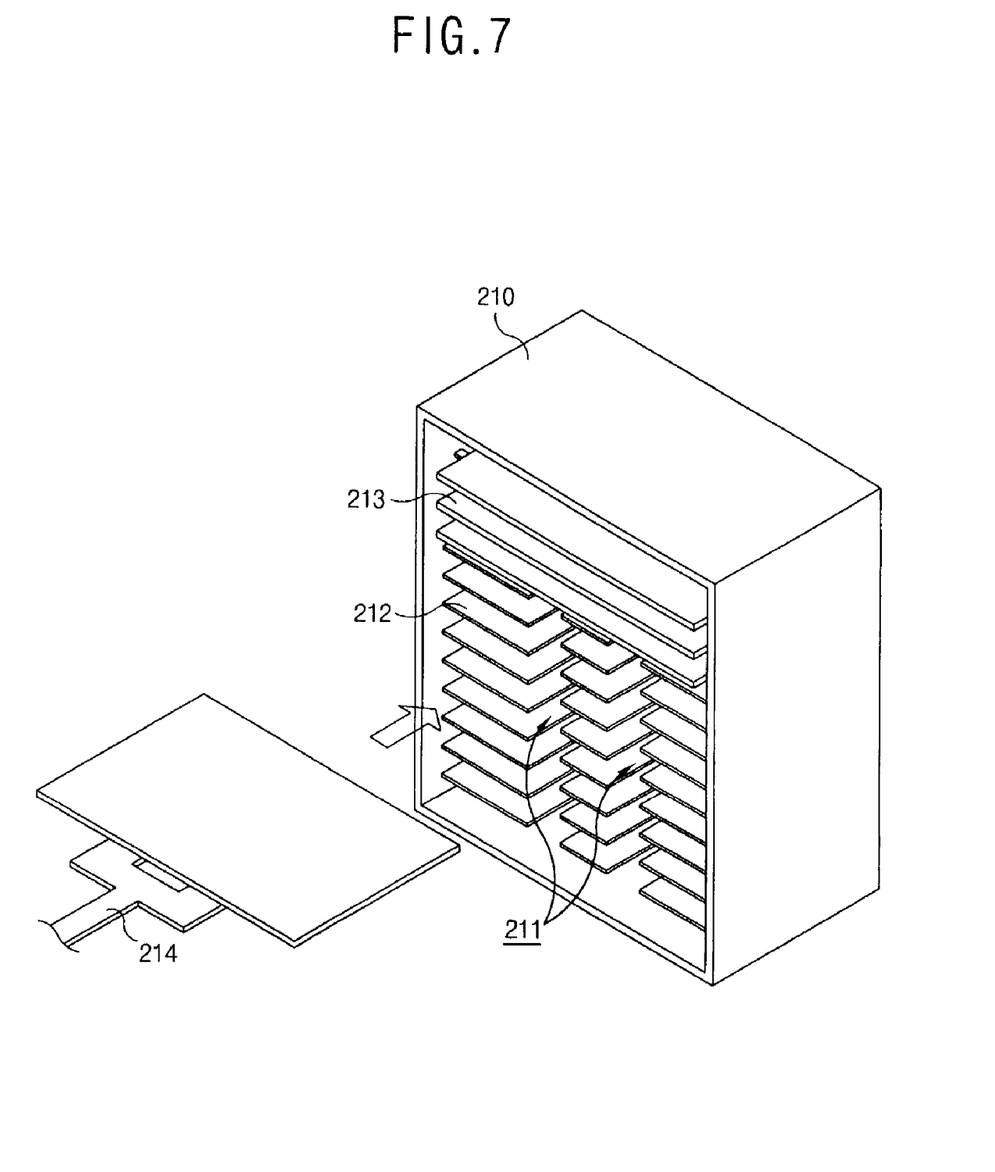
FIG. 7 illustrates a perspective view of a cassette for receiving substrates according to a second embodiment of the present invention.
Figure 8:
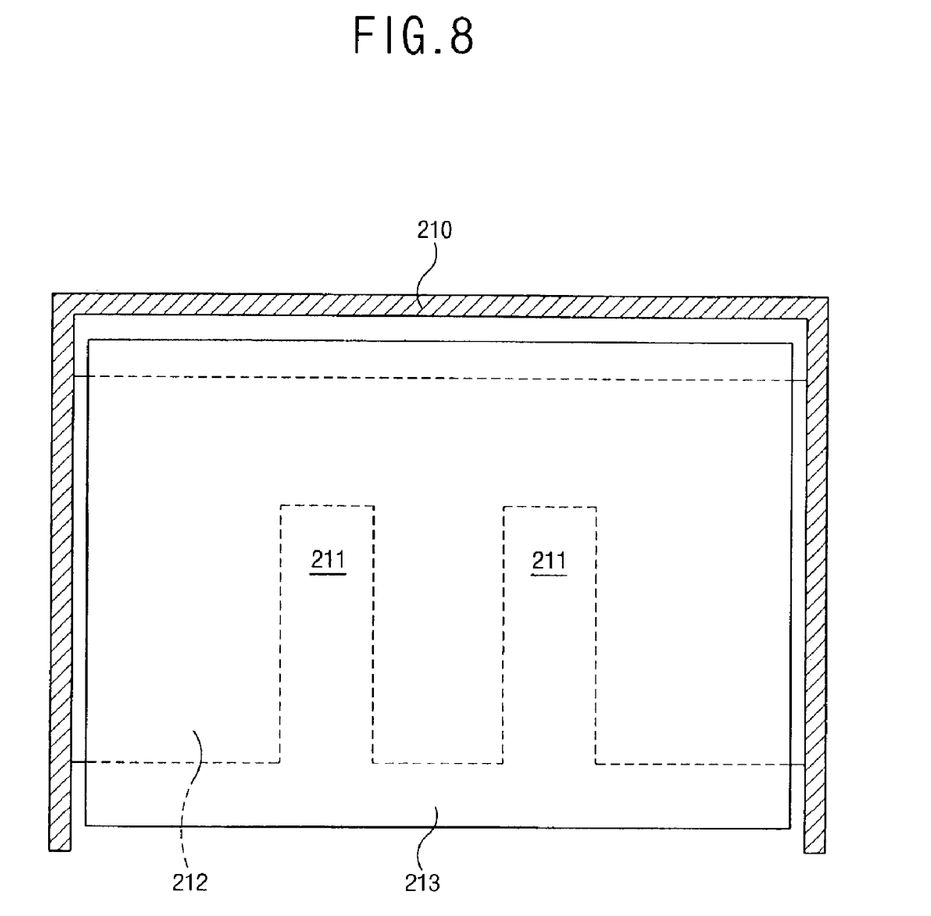
FIG. 8 is a layout of the cassette for receiving substrates according to the present invention illustrating that a mother substrate is supported by the support plates in FIG. 7.

FIG. 7 illustrates a perspective view of a cassette for receiving substrates according to a second embodiment of the present invention. FIG. 8 is a layout of the cassette for receiving substrates according to the present invention illustrating that a mother substrate is supported by the support plates in FIG. 7.

As shown in FIGS. 7 and 8, a support plate 212 protrudes from both lateral sides of a frame 210 to have a pair of separating spaces 211 in the middle portions and supports each mother substrate 213. In this case, unlike the first embodiment of the present invention, the separating spaces 211 of the second embodiment of the present invention in the middle portions of the support plate 212 provide a robot arm 214 with a minimum space.

Hence, the support plates according to the second embodiment of the present invention prevent the deterioration of the mother substrate 213 more effectively than the support plates according to the first embodiment of the present invention. Besides, the support plates according to the second embodiment disperse the weight of the mother substrate 213.

As mentioned in the foregoing description, the cassette for receiving substrates according to the first embodiment of the present invention prepares the flat support plate protruding from the lateral sides of the frame to support the mother substrate. Hence, even the large-sized liquid crystal display panels are formed on the mother substrate by a liquid crystal dropping method, the present invention can minimize the deterioration of the mother substrate stored in the cassette. This is because the present invention disperses the weight of the mother substrate.

Therefore, the present invention prevents patterns of the liquid crystal display panels fabricated on the mother substrate from collapsing or being deteriorated, thereby reducing degradation of the product. Moreover, the present invention prevents a display failure of the product caused by the degradation in the liquid crystal characteristics in the area of the mother substrate contacting the support plate, thereby improving productivity.

Meanwhile, the separating spaces of the cassette for receiving substrates according to the second embodiment of the present invention provide the robot arm with a releasing space in the middle portions of the support plates. Hence, the second embodiment of the present invention prevents the deterioration caused by the bending of the central portion of the mother substrate more effectively than the first embodiment of the present invention. This is because the support plates of the second embodiment disperse the weight of the mother substrate more effectively.

It will be apparent to those skilled in the art that various modifications and variations can be made in the cassette for receiving substrates of the present invention without departing from the spirit or scope of the inventions. Thus, it is intended that the present invention covers the modifications and variations of this invention provided they come within the scope of the appended claims and their equivalents.

What is claimed is:

1. A cassette for receiving mother substrates, the mother substrates including a plurality of liquid crystal display panels, each including liquid crystal, the cassette comprising:
    a frame, including:
        a top wall having a front edge, a rear edge, a left edge and a right edge;
        a right wall having a front edge, a rear edge, a top edge and a bottom edge,
        wherein the right edge of the top wall meets the top edge of the right wall;
        a bottom wall having a front edge, a rear edge, a left edge and a right edge,
        wherein the bottom edge of the right wall meets the right edge of the bottom wall;
        a left wall having a front edge, a rear edge, a top edge and a bottom edge, wherein the left edge of the bottom wall meets the bottom edge of the left wall, and wherein the top edge of the left wall meets the left edge of the top wall; and
        a rear wall having a top edge, a bottom edge, a left edge and a right edge, wherein the top, bottom, left and right edges of the rear wall meet the rear edges of the top, bottom, left and right walls, respectively, and wherein the front edges of the top, bottom, left and right walls define a plane forming an open front side of the frame;
    a plurality of substantially flat E-shaped support plates attached in the frame to support rectangular mother substrates having large liquid crystal display panels formed thereon by a liquid crystal dropping method to be placed thereon, each support plate having an overall length of the support plate that is greater than an overall width of the support plate, each support plate including:
        a left widthwise edge attached to the left wall of the frame;
        a right widthwise edge attached to the right wall of the frame;
        a rear lengthwise edge disposed adjacent to and spaced from the rear wall of the frame and extending in a straight line from the left widthwise edge to the right widthwise edge;
        a front lengthwise edge disposed adjacent to and spaced from the plane forming the open front side of the frame, wherein the front lengthwise edge extends in a straight line from the left widthwise edge to the right widthwise edge except for first and second elongated notches formed in the front lengthwise edge of the support plate in order to accommodate a robot arm that is used to place a rectangular mother substrate on the E-shaped surface of the support plate, wherein the first and second elongated notches extend from the front lengthwise edge towards the rear lengthwise edge in a linear manner to match contours of the robot arm with an operational moving margin, wherein the plurality of E-shaped support plates contact with the mother substrates in surface-to-surface to minimize deformation of the mother substrates and to disperse the weight of the mother substrates, wherein a rear portion of the support plate extends from the left wall to the right wall to uniformly distribute a weight of the mother substrates in a lengthwise direction, wherein the width of the rear portion of the support plate is less than a length of each elongated notch and greater than a width of each elongated notch, wherein the width of the rear portion of the support plate is greater than a distance between the rear lengthwise edge of the support plate and the rear wall of the frame and is greater than a distance between the front lengthwise edge of the support plate and the plane forming the open front side of the frame, and wherein a wall thickness of the top, bottom, left, right and rear walls is less than the distance between the rear lengthwise edge of the support plate and the rear wall of the frame and is less than the distance between the front lengthwise edge of the support plate and the plane forming the open front side of the frame.

* * * * *